United States Patent
Kawano et al.

(10) Patent No.: US 8,253,104 B2
(45) Date of Patent: *Aug. 28, 2012

(54) METHOD AND APPARATUS FOR DETECTING TERAHERTZ WAVES

(75) Inventors: Yukio Kawano, Saitama (JP); Koji Ishibashi, Saitama (JP)

(73) Assignee: Riken, Saitama (JP)

( * ) Notice: Subject to any disclaimer, the term of this patent is extended or adjusted under 35 U.S.C. 154(b) by 457 days.

This patent is subject to a terminal disclaimer.

(21) Appl. No.: 12/551,918

(22) Filed: Sep. 1, 2009

(65) Prior Publication Data

US 2010/0051812 A1    Mar. 4, 2010

(30) Foreign Application Priority Data

Sep. 1, 2008 (JP) .................................. 2008-222980

(51) Int. Cl.
*G01J 1/02* (2006.01)
(52) U.S. Cl. .................................. 250/336.1; 250/338.1
(58) Field of Classification Search .............. 250/336.1, 250/338.1
See application file for complete search history.

(56) References Cited

U.S. PATENT DOCUMENTS

| | | | |
|---|---|---|---|
| 7,947,955 B2 * | 5/2011 | Kawano et al. | 250/341.1 |
| 2010/0006892 A1 * | 1/2010 | Kawano et al. | 257/187 |

FOREIGN PATENT DOCUMENTS

JP    2003-232730    8/2003

OTHER PUBLICATIONS

Seliuta et al. (2004). Detection of Terahertz/Sub-Terahertz Radiation by Asymmetrically-shaped 3DEG Layers. Electronics Letters 40 (10), 631-632.*
Meric, et al. (2008). Current Saturation in Zero-Bandgap, Top-Gated Graphene Field-Effect Transistors. Nature Nanotechnology, 654-659.*
Fuse et al. (2007). Coulomb Peak Shifts Under Terahertz-Wave Irradiation in Carbon Nanotube Single-Electron Transistors. Appl. Phys. Lett. 90, 013119, p. 1-3.*
T. Fuse, et.al, "Coulomb peak shifts under terahertz-wave irradiation in carbon nanotube single-electron transistors" Applied Physics Letters 90,013119(2007).
C. Otani, et.al, "Direct and Indirect Detection of Terahertz Waves using a Nb-based Superconducting Tunnel Junction" Journal of Physics: Conference Series, vol. 43, pp. 1303-1306(2006).

* cited by examiner

*Primary Examiner* — David Porta
*Assistant Examiner* — Casey Bryant
(74) *Attorney, Agent, or Firm* — Griffin & Szipl, P.C.

(57) ABSTRACT

A terahertz wave detecting apparatus includes a semiconductor chip 12 in which a 2-dimensional electron gas 13 is formed at a constant position from its surface, and a carbon nanotube 14, a conductive source electrode 15, a drain electrode 16 and a gate electrode 17 provided in close contact with the surface of the chip. The carbon nanotube 14 extends along the surface of the chip, where both ends of the tube are connected to the source electrode and the drain electrode of the chip, and the gate electrode 17 is spaced at a constant interval from the side surface of the carbon nanotube. Further, the apparatus includes a SD current detecting circuit 18 for applying a voltage between the source electrode and the drain electrode and for detecting SD current therebetween, a gate voltage applying circuit 19 for applying a variable gate voltage between the source electrode and the gate electrode, and a magnetic field generating device 20 for applying a variable magnetic field to the chip.

6 Claims, 9 Drawing Sheets terahertz wave

METHOD AND APPARATUS FOR DETECTING TERAHERTZ WAVES

This application claims priority from Japanese Patent Application No. 222980/2008, filed Sep. 1, 2008, the entire disclosure of which is incorporated herein by reference.

BACKGROUND OF THE INVENTION

1. Field of the Invention

The invention relates to an apparatus and a method for detecting the weak intensity and frequency of terahertz waves.

2. Description of the Related Art

In this context, the term "terahertz waves" means electromagnetic waves whose frequency is in the range of 1 to 10 THz (where, 1 THz=$10^{12}$ Hz), i.e., whose wavelength is in the range from 0.03 mm to 0.3 mm submillimeter-waves to the far-infrared region.

The terahertz waves are expected to be applied in a wide range of fields, ranging from basic science fields such as radio astronomy, materials science and bimolecular spectroscopy to practical fields such as security, information communication, the environment and medical care.

Nonetheless, in order to apply the terahertz waves to such a wide range of fields, since the terahertz waves are electromagnetic waves whose the frequency bandwidth is interposed between light (i.e., $10^{13}$ to $10^{15}$ Hz in frequency) such as infrared rays, visible rays, ultraviolet rays and a radio waves (i.e., $10^{13}$ to $10^{12}$ Hz in frequency), it is difficult to apply as it is to existing techniques such as optics and electronics.

Various detectors for detecting terahertz waves have been already proposed. In particular, Nonpatent Documents 1 and 2 disclose a detector capable of detecting very weak terahertz waves having the intensity of a few fW ($10^{-15}$ W). In addition, Patent Document 1 discloses a detector capable of detecting the frequency of terahertz waves.

In the Nonpatent document 1, the detector detects the terahertz waves by using carbon nanotubes on a silicon substrate on which a silicon oxide film is formed. Further, the Nonpatent document 2 is concerned with a terahertz wave detector using superconductivity.

The Patent Document 1 has an object to obtain a spectrum having a good frequency resolution in terms of improved signal-to-noise (S/N) ratio measurements. To achieve such an object, according to the Patent Document 1, as shown in FIG. 1, a main body 51 of the detector includes a substrate 53, and a detecting element portion (i.e., a gap g between metal layers 55 and 56), used as an optical switch device, formed on +Z surface of the substrate 53. The element 60, which is almost equal to the substrate 53 in a refractive index, is provided on the −Z side of the substrate 53 so as not to form a surface reflecting the terahertz pulse waves between the −Z surface of the element 60 and the +Z surface of the substrate 53. The shape of the −Z surface of the element 60 and the thickness of the element 60 are set up such that the terahertz waves incident from a certain region of the −Z surface of the element 60 and then focused in the vicinity of the region of the gap g (i.e., the effective region) does not substantially enter the gap g after the light reflected at the +Z surface of the substrate 53 is reflected at the −Z surface of the element 60 for the first time, or otherwise enters the gap g only after it is additionally reflected two or more times.

[Nonpatent Document 1]

T. Fuse, et. al, "Coulomb peak shifts under terahertz-wave irradiation in carbon nanotube single-electron transistors" Applied Physics Letters 90,013119(2007).

[Nonpatent Document 2]

C. Otani, et. al, "Direct and Indirect Detection of Terahertz Waves using a Nb-based Superconducting Tunnel Junction" Journal of Physics: Conference Series, vol. 43, pp. 1303-1306(2006).

[Patent Document 1]

Japanese Unexamined Patent Application Publication No. 2003-232730"terahertz wave detector"

The terahertz wave detector of the Nonpatent document 1 uses the terahertz response of electrons captured in the impurity level of a silicon oxide film. Therefore, in manufacturing the detector, it is difficult to dispose the carbon nanotube at a desired position with respect to the impurity. Moreover, since the impurity level does not have sharp wavelength selectivity, it is difficult to measure the frequency of the terahertz waves.

According to the Nonpatent document 2, since the terahertz wave detector needs ultralow temperatures of 0.3 to 0.4 K to obtain a high sensitivity, it requires using expensive and large scale helium 3 cryostat.

Further, according to the Patent Document 1, since in the terahertz wave detector, the terahertz waves are absorbed by the element 60, it is difficult to detect a very weak terahertz waves having the intensity of a few fW ($10^{-15}$ W)

SUMMARY OF THE INVENTION

The invention is made in order to address the above issues. An object of the invention is to provide an apparatus and a method for detecting terahertz waves capable of clearly detecting the intensity and exactly measuring the frequency of the very weak terahertz waves by a small-scale apparatus which does not require ultralow temperatures.

According to an embodiment of the invention, there is provided a terahertz wave detecting apparatus including:

a semiconductor chip in which a 2-dimensional electron gas is formed at a constant position from its surface;

a carbon nanotube, a conductive source electrode, a conductive drain electrode and a conductive gate electrode provided in close contact with the surface of the semiconductor chip, in which the carbon nanotube extends along the surface of the semiconductor chip and has both ends connected to the source electrode and the drain electrode on the semiconductor chip, and the gate electrode is spaced at a constant interval from the side surface of the carbon nanotube;

a SD current detecting circuit for applying a predetermined voltage between the source electrode and the drain electrode and for detecting a SD current therebetween;

a gate voltage applying circuit for applying a variable gate voltage between the source electrode and the gate electrode; and a magnetic field generating device for applying a variable magnetic field to the semiconductor chip.

According to the embodiment of the invention, the terahertz wave detecting apparatus includes a detection control device controlling the SD current detecting circuit, the gate voltage applying circuit and the magnetic field generating device, and calculates the frequency and intensity of the terahertz waves based on the SD current, the gate voltage and the value of the magnetic field.

The detection control device enables the measuring of dependency of a SD current with respect to a gate voltage and a magnetic field while irradiating a terahertz wave, the detecting of the value of the magnetic field when there is the largest shift in the peak of the SD current with respect to the gate voltage, and the calculating of the frequency of the terahertz waves from the value of the magnetic field.

Further, the detection control device enables the fixing of the value of the magnetic field and the gate voltage when there is the largest shift in the peak of the SD current with respect to the gate voltage, and the measuring of the change of the SD current with respect to a time while irradiating the terahertz waves.

Furthermore, according to another embodiment of the invention, there is provided a method of detecting terahertz waves including:

preparing a terahertz wave detecting apparatus, including a semiconductor chip in which a 2-dimensional electron gas is formed at a constant position from its surface, a carbon nanotube, a conductive source electrode, a conductive drain electrode and a conductive gate electrode are provided in close contact with the surface of the semiconductor chip, where the carbon nanotube extends along the surface of the semiconductor chip and has both ends connected to the source electrode and the drain electrode on the semiconductor chip, and the gate electrode is spaced at a constant interval from the side surface of the carbon nanotube, a SD current detecting circuit for applying a predetermined voltage between the source electrode and the drain electrode and for detecting a SD current therebetween, a gate voltage applying circuit for applying a variable gate voltage between the source electrode and the gate electrode, and a magnetic field generating device for applying a variable magnetic field to the semiconductor chip;

measuring dependency of a SD current with respect to a gate voltage and a magnetic field while irradiating a terahertz wave;

detecting the value of the magnetic field when there is the largest shift in the peak of the SD current with respect to the gate voltage; and calculating the frequency of the terahertz waves based on the value of the magnetic field.

According to the another preferred embodiment of the invention, the method of detecting terahertz waves comprises fixing of the value of the magnetic field and the gate voltage when there is the largest shift in the peak of the SD current with respect to the gate voltage, and measuring of the change of the SD current with respect to a time when irradiating the terahertz waves.

According to the embodiments of the invention, it was confirmed from the test results performed at a temperature of 2.5 K as described later that the frequency of the terahertz waves can be obtained from a magnetic field when the terahertz waves are irradiated, the peak of the SD current with respect to the gate voltage (Coulomb peak) is shifted to the positive gate voltage side and then the amount of the shift (Coulomb peak shift) is at a maximum value.

In addition, it was confirmed from the test results performed at a temperature of 2.5 K as described later that, by fixing the value of the magnetic field and the gate voltage when there is the largest shift in the peak of the SD current with respect to the gate voltage, for example, a terahertz wave 1 of only single photon can be detected.

Thus, according to the apparatus and method of the invention, the intensity of a very weak terahertz waves having the intensity of a few fW ($10^{-15}$ W) can be clearly detected and the frequency thereof can be exactly measured using a small-scale apparatus which does not require ultralow temperatures of 0.3 to 0.4 K.

DESCRIPTION OF THE PREFERRED EMBODIMENTS

Figure 1:
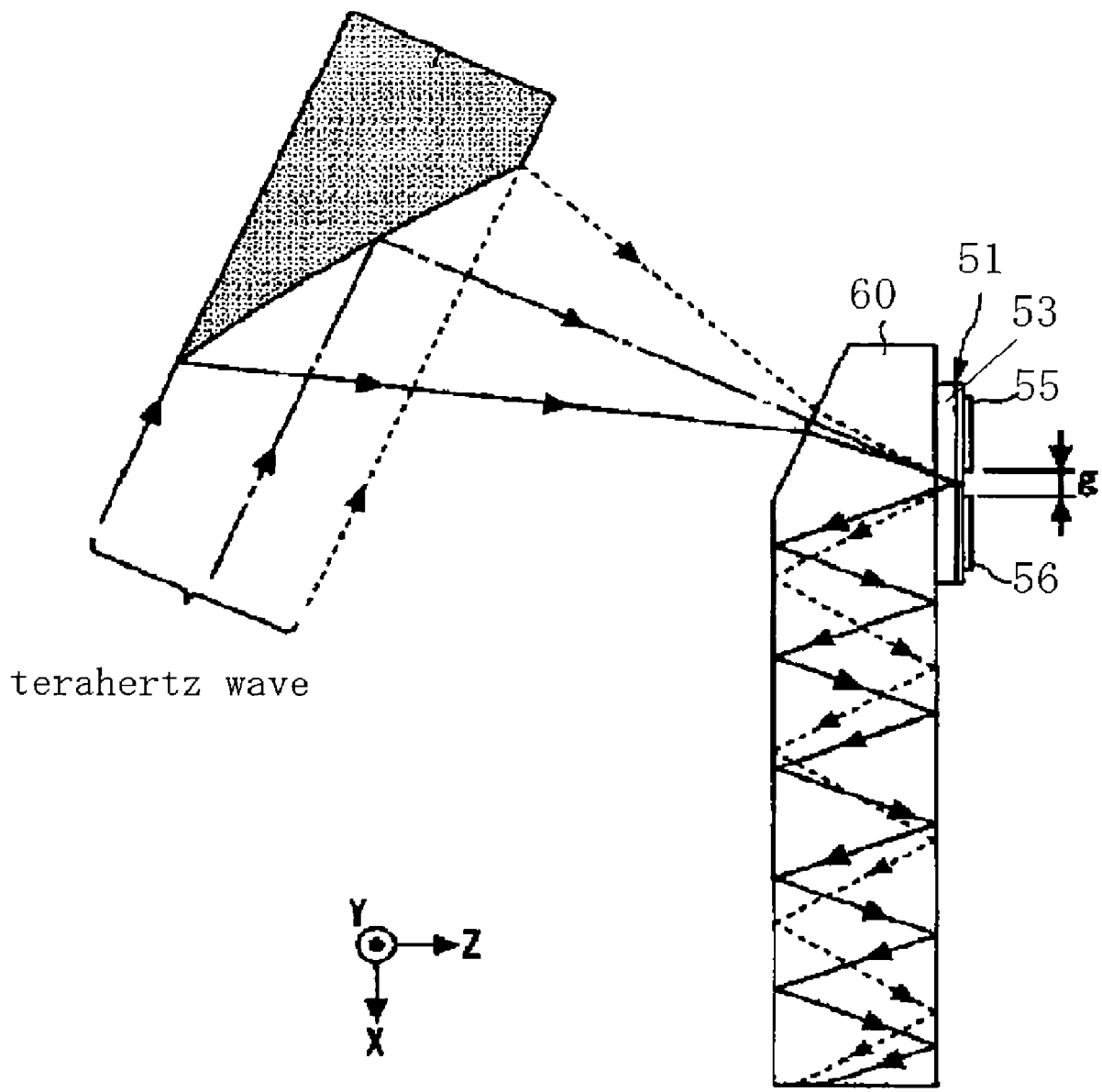
FIG. 1 is a diagram illustrating the elements of the detector according to Patent Document 1.

Now, the preferred embodiments of the invention will be described in detail with reference to accompanying drawings. In this case, like reference numerals identify correspondingly throughout and, for simplicity, description thereof will be omitted.

Figure 2:
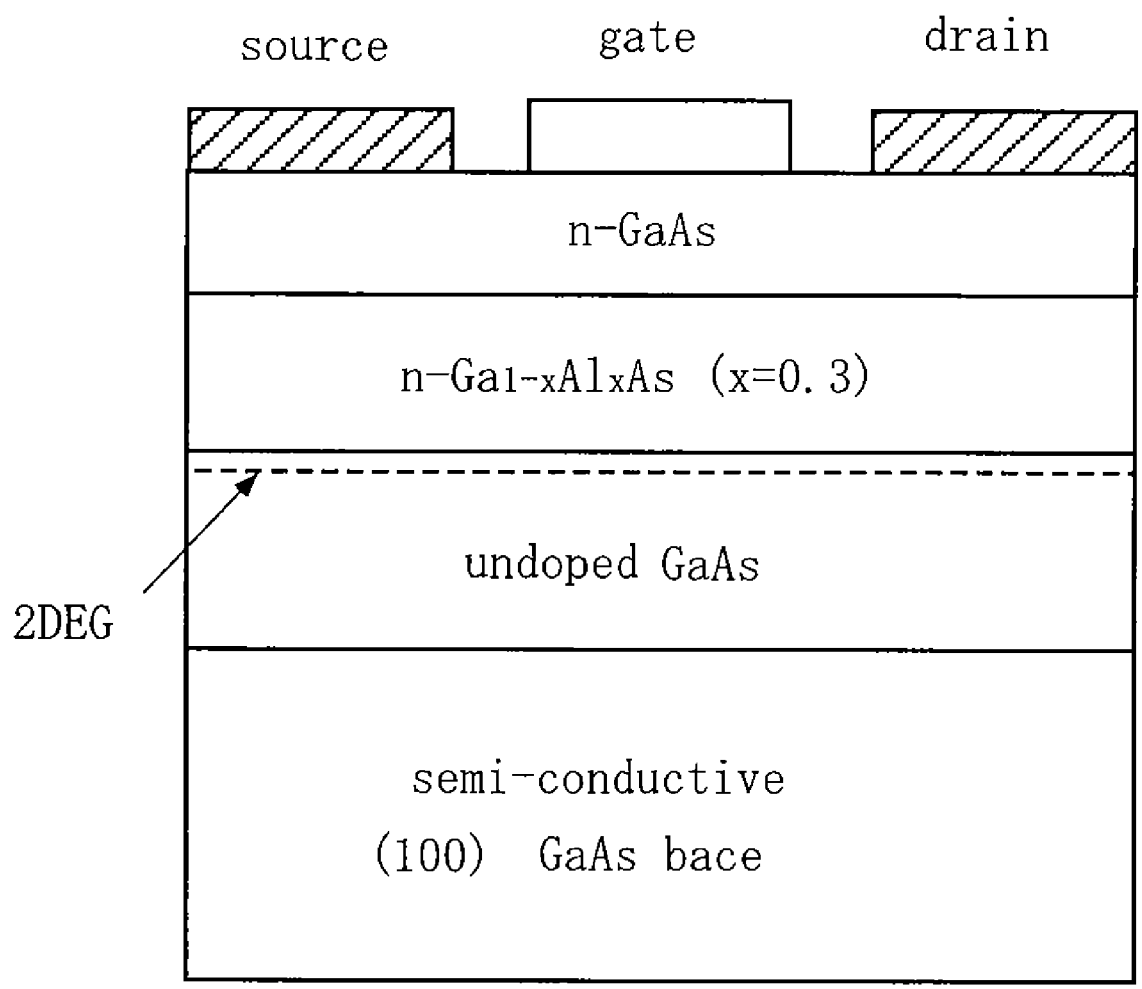
FIG. 2 is a diagram for explaining a High Electron Mobility Transistor (HEMT).

FIG. 2 is a diagram for explaining a High Electron Mobility Transistor (HEMT) used in the invention.

The High Electron Mobility Transistor (HEMT) is a transistor using a 2-dimensional electron gas (simply referred to as "2 DEG") and has characteristic that the 2-dimensional electron gas is formed using modulation doping and electron mobility is high. Thus, it allows controlling the electric current so as to flow rapidly from the source to the drain using the high electron mobility.

Further, as used herein, the term "2-dimensional electron gas" means electrons traveling along the junction interface between a semiconductor and an insulator or hetero-semiconductors, i.e., rare electrons having momentum only in a 2-dimensional plane.

Figure 3A:
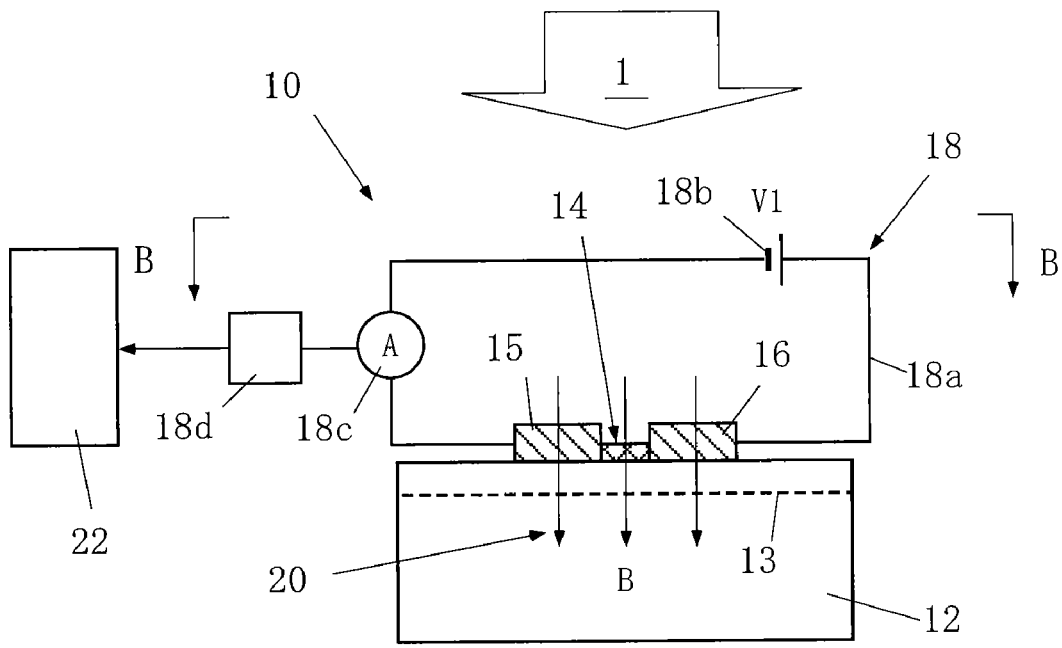
FIG. 3A is a cross-sectional view illustrating a terahertz wave detecting apparatus according to the invention.
Figure 3B:
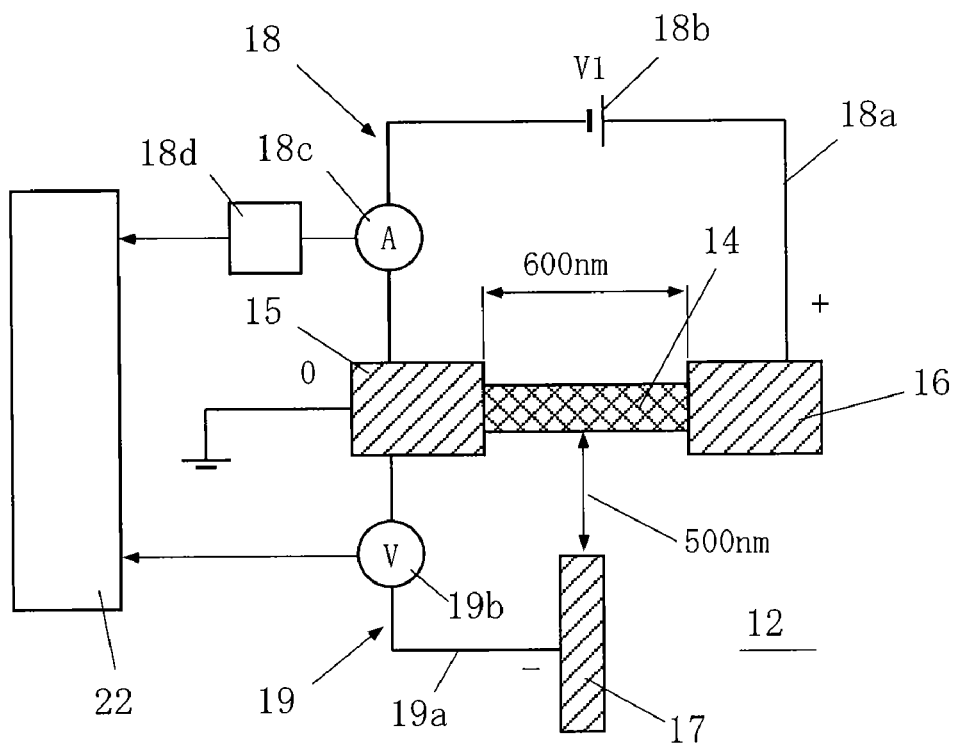
FIG. 3B is a plan view viewed from the line B-B of FIG. 3A.

FIG. 3A is a cross-sectional view illustrating a terahertz wave detecting apparatus according to the invention and FIG. 3B is a plan view viewed from the line B-B of FIG. 3A.

As shown in FIGS. 3A and 3B, the terahertz wave detecting apparatus 10 of the invention includes a semiconductor chip 12, a carbon nanotube 14, a source electrode 15, a drain electrode 16, a gate electrode 17, a SD current detecting circuit 18, a gate voltage applying circuit 19, and a magnetic field generating device 20.

The semiconductor chip 12 is a High Electron Mobility Transistor (HEMT) in which the 2-dimensional electron gas 13 is formed at an equal position (or distance) from its surface. In addition, in this case, the HEMT without gate, source and drain shown in FIG. 2 is referred to as "semiconductor chip 12".

In the embodiments described later, the distances from the surface of the 2-dimensional electron gas 13 is approximately 60 nm, but it may be less than 60 nm or may be 60 nm or greater.

The carbon nanotube 14 is an element in which six-membered ring networks (i.e., graphene sheet) formed from carbons are formed to a single layered coaxial tube or multi-layered coaxial tubes. The carbon nanotube 14 has a tolerance to current density which is 1000 times greater than copper, has the characteristic that the longitudinal current varies greatly due to a few photons by the terahertz wave 1, and when used in the detecting unit it can detects the waves with a higher sensitivity compared with the 2-dimensional electron gas 13.

In the embodiments described later, the carbon nanotube 14 is 600 nm in length, extended in close contact with and along the surface of the semiconductor chip 12, and both ends of the tube are connected to the source electrode 15 and the drain electrode 16.

The source electrode 15 and the drain electrode 16 are disposed with one carbon nanotube 14 interposed therebetween, disposed in the periphery in the longitudinal direction at equal intervals, and are provided in close contact with the surface of the semiconductor chip 12. In this case, the source electrode 15 is grounded and maintained at 0 V.

Further, in the embodiments described later, the source electrode 15 and the drain electrode 16 are a thin film formed of Ti/Au.

The gate electrode 17 is spaced at a constant interval (e.g., in the embodiment described later, 500 nm) from the side surface of the carbon nanotube 14, and is provided in close contact with the surface of the semiconductor chip 12.

In the embodiments described later, the gate electrode 17 is a thin film formed of Ti/Au.

The SD current detecting circuit 18 includes a conductive line 18a electrically connecting the source electrode 15 and the drain electrode 16, and a DC power source 18b and an ammeter 18c provided in the mid course of the conductive line 18a. The DC power source 18b applies a predetermined voltage between the source electrode 15 and the drain electrode 16, where a plus (+) voltage is applied to the drain electrode 16. In addition, the ammeter 18c detects the current (hereinafter, referred to as "source-drain current" or "SD current") flowing between the source electrode 15 and the drain electrode 16. In the embodiments described later, the predetermined voltage is 1.5 mV.

In addition, the noise cut filter 18d is removably equipped in the ammeter 18c so as to remove severe fluctuations in noise from the output signal of the ammeter 18c.

The gate voltage applying circuit 19 includes a conductive line 19a electrically connecting the source electrode 15 and the gate electrode 17, and a DC power source 19b provided in the mid course of the conductive line 19a. The DC power source 19b applies a variable gate voltage between the source electrode 15 and the gate electrode 17, where a minus (−) voltage is applied to the gate electrode 17. Hereinafter, the voltage between the source electrode 15 and the gate electrode 17 is referred to as "gate voltage".

Figure 4A:
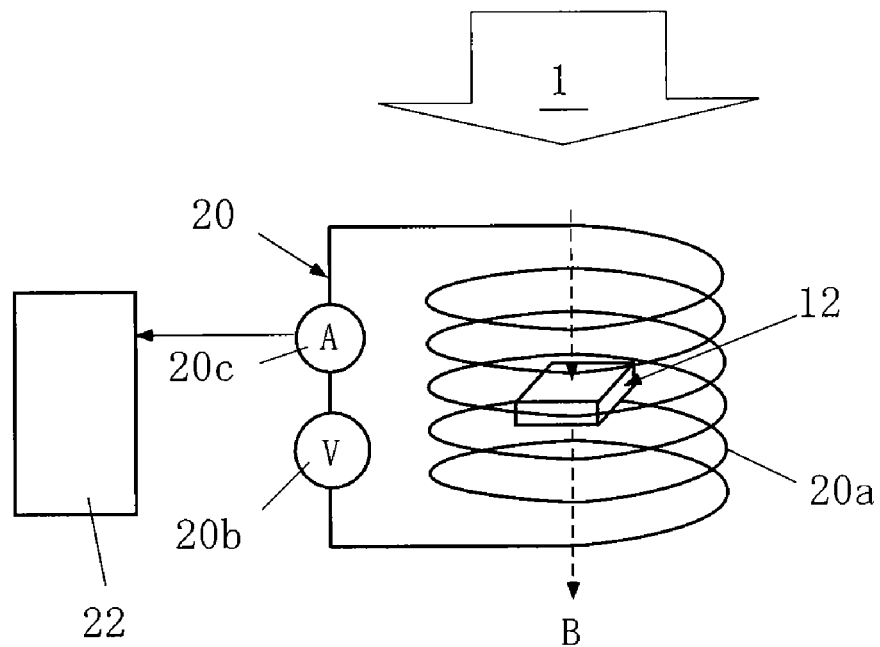
FIG. 4A is a diagram schematically illustrating a magnetic field generating device shown in FIG. 3A and FIG. 3B.
Figure 4B:
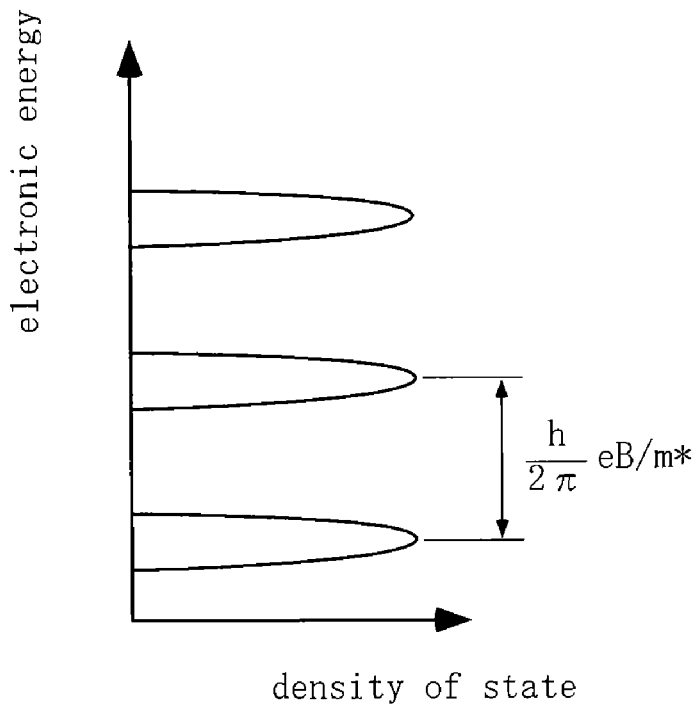
FIG. 4B is a diagram for explaining the principle of detecting the terahertz waves.

FIG. 4A is a diagram schematically illustrating a magnetic field generating device of FIG. 3A and FIG. 3B, and FIG. 4B is a diagram for explaining the principle of detecting the terahertz waves.

As shown in FIG. 4A, the magnetic field generating device 20 includes a coil 20a surrounding the optical axis of the terahertz wave 1 entering the semiconductor chip 12, a DC power source 20b applying a predetermined voltage to both ends of the coil 20a, and an ammeter 20c displaying current (Hereinafter, referred to as "Coil current".) flowing through the coil 20a, and applies magnetic field B to the semiconductor chip 12. In actual measurement, by inputting a predetermined current, the voltage applied to the coil can be detected.

The magnetic field B can be primarily calculated from the coil current.

FIG. 4B is a diagram illustrating the resultant Landau level according to the applied magnetic field. In this case, the horizontal axis represents the density of state and the vertical axis represents the electronic energy.

As shown in FIG. 4B, when the photon energy hf of the irradiated electromagnetic waves are equal to the energy gap of the Landau level $(h/2\pi) eB/m^*$ - - - (1), a very large absorption of the electromagnetic waves occur. This phenomenon is referred to as "cyclotron absorption" or "cyclotron resonance". Where, h is Planck constant, e is elementary electric charge, B is magnetic field, and $m^*$ is effective mass (e.g., for GaAs, 0.0665 times the mass of a free electron.) of an electron in a crystal.

The photon energy hf of the terahertz waves when the cyclotron absorption occurs is similar to the energy gap of the Landau level when the cyclotron absorption occurs. That is, $hf=(h/2\pi) eB/m^*$ - - - (2) is established.

From this formula, since the h, e, $m^*$ are known constants, except the magnetic field B, the frequency f of the terahertz waves can be calculated from the magnetic field B when the cyclotron absorption occurs.

The terahertz wave detecting apparatus 10 according to the invention uses the cyclotron absorption of the 2-dimensional electron gas 13.

Referring to FIGS. 3A and 3B and FIGS. 4A and 4B, the terahertz wave detecting apparatus 10 according to the invention further includes a detection control device 22. The detection control device 22 is, for example, a computer (PC), and has functions for controlling the SD current detecting circuit 18, the gate voltage applying circuit 19 and the magnetic field generating device 20, and calculating the frequency and intensity of the terahertz waves from the SD current, the gate voltage and the value of the magnetic field.

Thus, the detection control device 22 measures the dependency of the SD current with respect to the gate voltage and the magnetic field while irradiating the terahertz wave 1, detects the value of the magnetic field when there is the largest shift in the peak of the SD current with respect to the gate voltage, and calculates the frequency of the terahertz waves from the value of the magnetic field.

In addition, while irradiating the terahertz waves, the detection control device 22 determines the values of the magnetic field and the gate voltage when there is the largest shift in the peak of the SD current with respect to the gate voltage, and measures the change of the SD current with respect to the time.

First Embodiment

The very weak terahertz waves 1 having an intensity of a few fW ($10^{-15}$ W) were irradiated by applying a voltage of 1.5 mV to the drain electrode 16 at a temperature of 2.5 K, using the terahertz wave detecting apparatus described above according to the invention. In addition, in this test, severe fluctuations in noise were removed by mounting a noise cut filter 18d on the ammeter 18c.

Figure 5:
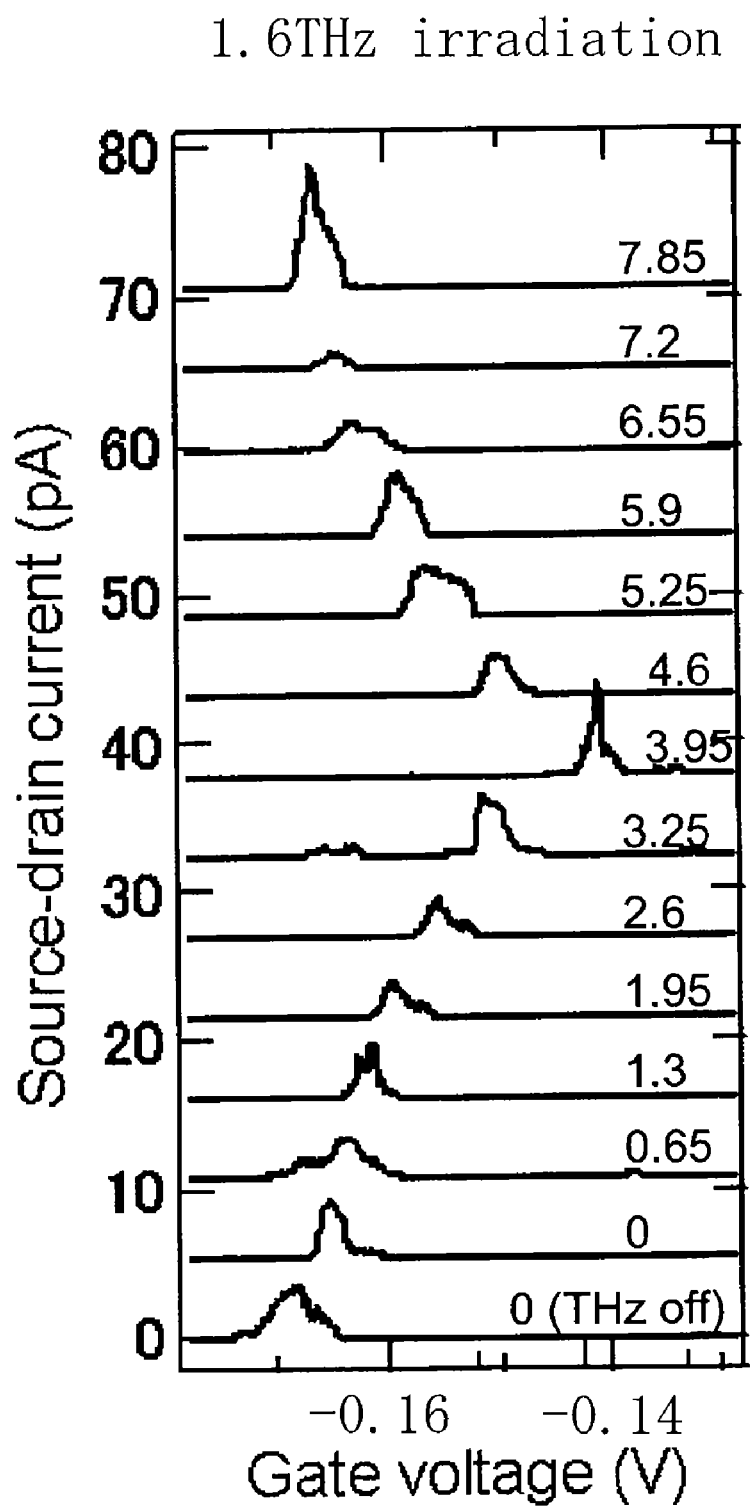
FIG. 5 illustrates test results where the terahertz wave 1 of 1.6 THz is detected.

FIG. 5 illustrates test results where the terahertz wave 1 of 1.6 THz is detected. In FIG. 5, the horizontal axis represents the gate voltage (V) and the vertical axis represents the source-drain current (pA).

In FIG. 5, the numbers denoted at the right side of the respective data are the intensity of the magnetic field B (T). In addition, for clarity, the respective data are denoted by shifting vertically, and the horizontal lines in the respective data are denoted as 0 (pA).

It is understood from FIG. 5 that for the magnetic field B ranging from 0 to 3.95 (T), the signal detection position of the respective data shifts to the right side and has the maximum value at 3.95 (T), and for the magnetic field B ranging from above 3.95 (T) to 7.85 (T), the amount of the shift gradually decreases.

That is, it is apparent from FIG. 5 that by irradiating the terahertz wave 1, the Coulomb peak shifts toward the positive value of the gate voltage. Further, the amount of the peak shift (i.e., the gate voltage difference) greatly depends on the magnetic field B applied vertically to the device, and has a maximum value at 3.95 T.

It is considered that the amount of the shift (referred to as "the shift of the Coulomb peak") is proportional to the absorption efficiency of the detected terahertz waves by the 2-dimensional electron gas 13. That is, the magnetic field B in which the amount of the shift of the Coulomb peak has a maximum value corresponds to the value obtained in the cyclotron resonance, derived from the wavelength 184 μm (1.6 THz) of the irradiated terahertz wave 1 and the effective mass 0.0665 $m_0$ of an electron in GaAs ($m_0$: mass of a free electron).

Thus, from the magnetic field B (in this example, 3.95 (T)) in which the amount of the shift of the Coulomb peak has maximum value, the frequency f of the terahertz waves can be calculated using the formula (2).

Figure 6:
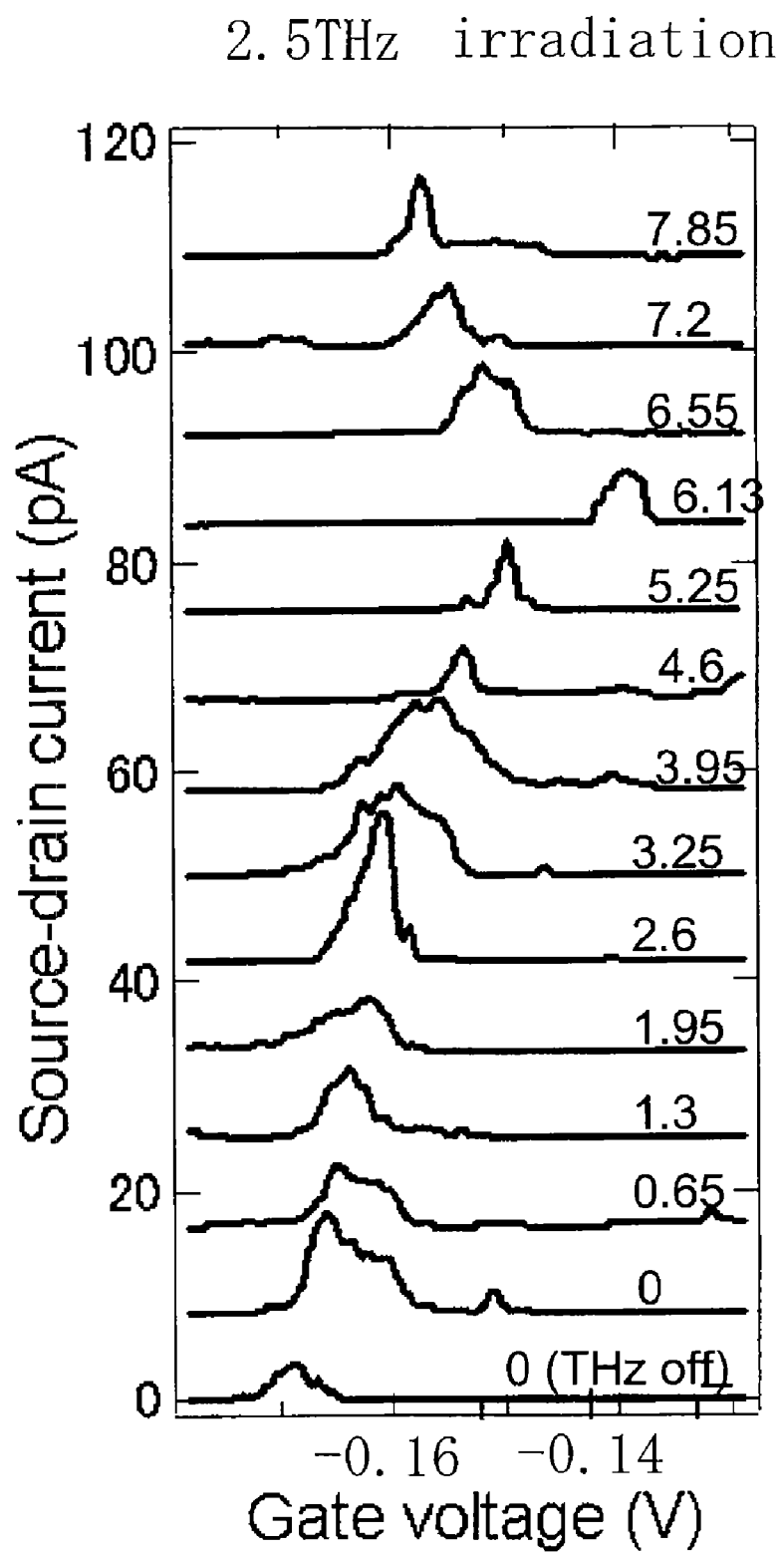
FIG. 6 illustrates test results where the terahertz wave 1 of 2.5 THz is detected.

FIG. 6 illustrates test results where the terahertz wave 1 of 2.5 THz is detected. It is understood from FIG. 6 that for the magnetic field B ranging from 0 to 6.13 (T), the signal detection position of the respective data shifts toward the right side and has the maximum value at 6.13 (T), and for the magnetic field B ranging from above 6.13 (T) to 7.85 (T), the amount of the shift gradually decreases.

It is understood from FIGS. 5 and 6 that if the wavelength of the terahertz wave 1 changes, then the magnetic field in which the peak shift has maximum value changes proportionally. This means that a neighboring CNT, as an electrometer, reads carriers out of the 2DEG excited by the terahertz wave 1.

Second Embodiment

The very weak terahertz waves 1 having an intensity of a few fW ($10^{-15}$ W) were irradiated by applying a voltage of 1.5 mV to the drain electrode 16 at a temperature of 2.5 K, using the terahertz wave detecting apparatus described above according to the invention. In this test, the noise cut filter 18d was removed from the ammeter 18c.

In addition, the terahertz wave 1 was irradiated at 1.6 THz, and the magnetic field B was fixed at 3.95 (T), in which the shift of the Coulomb peak has maximum value. The gate voltage was fixed at the shift position of the Coulomb peak (in this example, −1.41 V).

Figure 7:
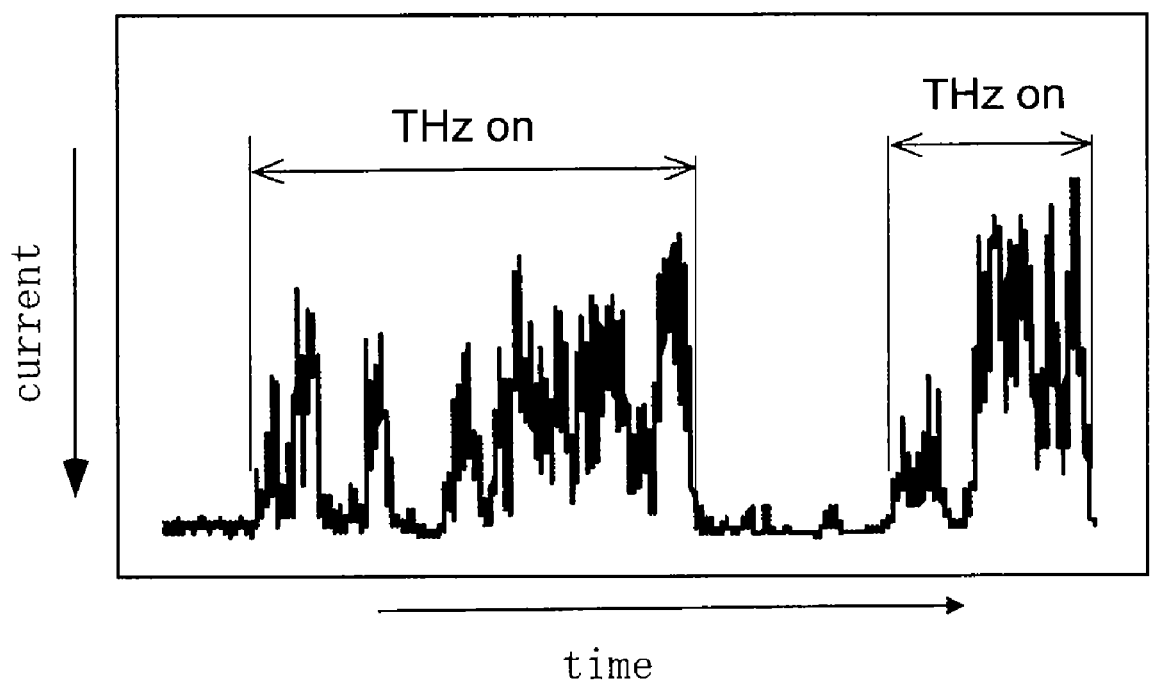
FIG. 7 illustrates results where the terahertz wave 1 of 1.6 THz is detected by the terahertz wave detecting apparatus according to the invention.

FIG. 7 illustrates results where the terahertz wave 1 of 1.6 THz is detected by the terahertz wave detecting apparatus according to the invention. In FIG. 7, the horizontal axis represents time and the vertical axis is current (i.e., the source-drain current).

It is understood from the FIG. 7 that even though the terahertz wave 1 is very weak, in the case of irradiating the terahertz wave 1 (THz on), the detection data is greatly changed vertically. Such fluctuation of the current indicates that a few photons were detected. Thus, it is apparent that the terahertz wave detecting apparatus according to the invention enables the detecting of the very weak terahertz wave 1, for example, the terahertz wave 1 of even single photon.

Figure 8:
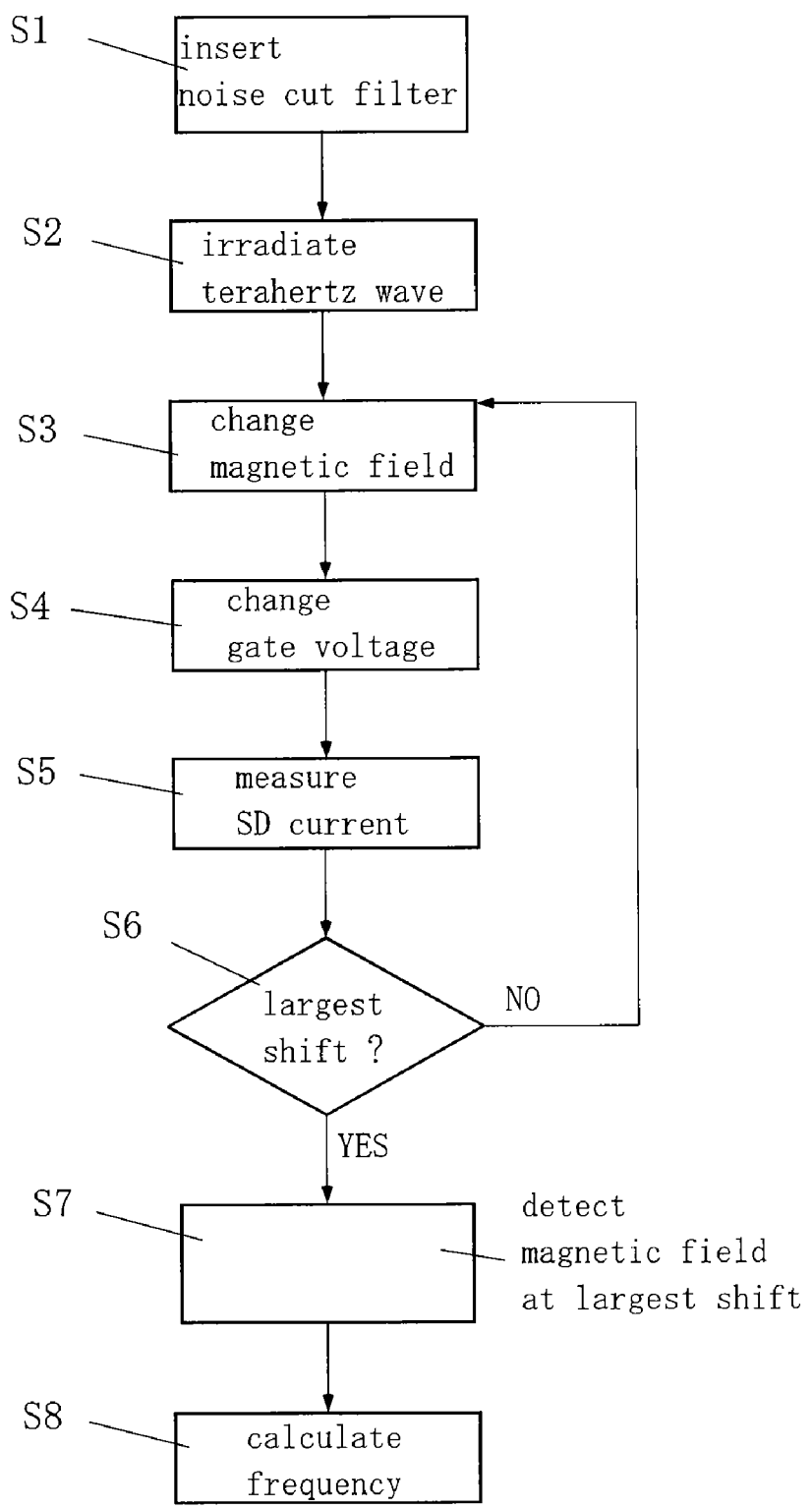
FIG. 8 is a flow diagram illustrating a method of detecting the terahertz waves according to the invention.

FIG. 8 is a flow diagram illustrating a method of detecting the terahertz waves according to the invention. Further, FIG. 8 illustrates a method of calculating the frequency of the terahertz wave 1 using the terahertz wave detecting apparatus described above.

According to the method of the invention calculating the frequency of the terahertz wave 1, the noise cut filter 18d is inserted to the ammeter 18c (S1), and the terahertz wave 1 is irradiated (S2) and simultaneously the dependency of the source-drain current (i.e., the SD current) is measured with respect to the gate voltage and the magnetic field (S3 to S5).

Subsequently, the value of the magnetic field B is detected when there is the largest shift in the peak of the SD current with respect to the gate voltage (S6 to S7).

Then, by substituting the formula (2) with the value of the magnetic field B, the frequency f of the terahertz wave 1 can be calculated (S8).

Figure 9:
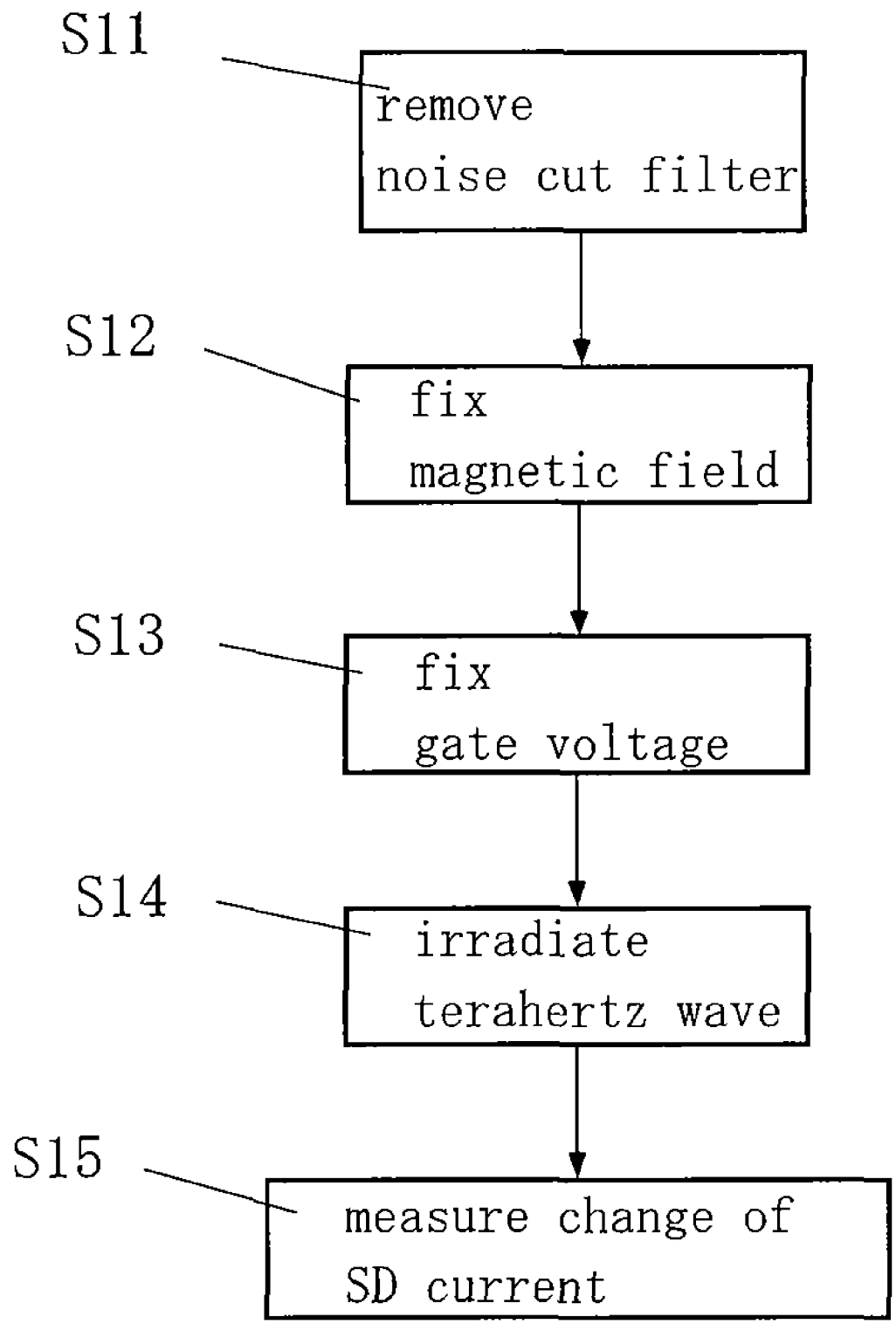
FIG. 9 is a flow diagram illustrating another method of detecting the terahertz waves according to the invention.

FIG. 9 is a flow diagram illustrating another method of detecting the terahertz waves according to the invention. Further, FIG. 9 illustrates a method of calculating the very weak terahertz wave 1 of a few fW ($10^{-15}$ W) using the terahertz wave detecting apparatus described above.

According to the another method of the invention detecting the very weak terahertz wave 1, a filter for cutting the noise is removed from a current measurement system (S11), the gate voltage is fixed at the value of the magnetic field B in which the shift of the Coulomb peak has maximum value (S12), the gate voltage is fixed at the position corresponding to a current peak at the time of irradiating the terahertz wave 1 (S13), the terahertz wave 1 is irradiated (S14), and simultaneously the change of the source-drain current (i.e., the SD current) with respect to the time is measured (S15).

Thus, by measuring the telegraph switching of the current, since a few photons can be detected, highly-sensitive detection can be accomplished.

According to the invention described above, it was confirmed from the test results performed at a temperature of 2.5 K that the frequency of the terahertz waves can be obtained from the maximum magnetic field when the terahertz waves are irradiated, the peak of the SD current with respect to the gate voltage (Coulomb peak) is shifted to the positive gate voltage side and then the amount of the shift (Coulomb peak shift) is at a maximum value.

Furthermore, it was confirmed from the test results performed at a temperature of 2.5 K that by fixing the value of the magnetic field and the gate voltage when there is the largest shift in the peak of the SD current with respect to the gate voltage, the terahertz wave 1, for example, even single photon can be detected.

Thus, according to the apparatus and method of the invention, even though the very weak terahertz waves has the intensity of a few fW ($10^{-15}$ W), the intensity of the very weak terahertz waves can be clearly detected and the frequency thereof can be exactly measured using a small-scale apparatus which does not require the ultralow temperatures of 0.3 to 0.4 K.

While the invention has been described with reference to exemplary embodiments, it should be understood that the invention is not limited to the examples and embodiments described above and various changes and variations thereof may be made without departing from the spirit or scope of the invention.

What is claimed is:

1. A terahertz wave detecting apparatus comprising:
   a semiconductor chip in which a 2-dimensional electron gas is formed at a constant position from from a surface of the semiconductor chip;
   a carbon nanotube, a conductive source electrode, a conductive drain electrode and a conductive gate electrode provided in close contact with the surface of the semiconductor chip, in which the carbon nanotube extending along the surface of the semiconductor chip and having both ends connected to the source electrode and the drain electrode on the semiconductor chip, and the gate electrode being spaced at a constant interval from the side surface of the carbon nanotube;

a SD (source-drain) current detecting circuit for applying a predetermined voltage between the source electrode and the drain electrode and for detecting a SD current therebetween;

a gate voltage applying circuit for applying a variable gate voltage between the source electrode and the gate electrode; and a magnetic field generating device for applying a variable magnetic field to the semiconductor chip.

2. The terahertz wave detecting apparatus of claim 1, further comprising:

a detection control device controlling the SD current detecting circuit, the gate voltage applying circuit and the magnetic field generating device, and calculating the frequency and intensity of the terahertz waves based on the SD current, the gate voltage and the value of the magnetic field.

3. The terahertz wave detecting apparatus of claim 2, wherein the detection control device measures dependency of the SD current with respect to the gate voltage and the magnetic field while irradiating terahertz waves, detects the value of the magnetic field when there is the largest shift in the peak of the SD current with respect to the gate voltage, and calculates the frequency of the terahertz waves based on the value of the magnetic field.

4. The terahertz wave detecting apparatus of claim 3, wherein the detection control device fixes the value of the magnetic field and the gate voltage when there is the largest shift in the peak of the SD current with respect to the gate voltage, and measures the change of the SD current with respect to a time while irradiating the terahertz waves.

5. A method of detecting terahertz waves comprising:

preparing a terahertz wave detecting apparatus, including a semiconductor chip in which a 2-dimensional electron gas is formed at a constant position from its surface, a carbon nanotube, a conductive source electrode, a conductive drain electrode and a conductive gate electrode are provided in close contact with the surface of the semiconductor chip, the carbon nanotube extending along the surface of the semiconductor chip and having both ends connected to the source electrode and the drain electrode on the semiconductor chip, and the gate electrode being spaced at a constant interval from the side surface of the carbon nanotube, a SD current detecting circuit for applying a predetermined voltage between the source electrode and the drain electrode and for detecting a SD current therebetween, a gate voltage applying circuit for applying a variable gate voltage between the source electrode and the gate electrode, and a magnetic field generating device for applying a variable magnetic field to the semiconductor chip;

measuring dependency of a SD current with respect to a gate voltage and a magnetic field while irradiating a terahertz wave;

detecting the value of the magnetic field when there is the largest shift in the peak of the SD current with respect to the gate voltage; and calculating the frequency of the terahertz waves based on the value of the magnetic field.

6. The method of detecting terahertz waves of claim 5, further comprising:

fixing the value of the magnetic field and the gate voltage when there is the largest shift in the peak of the SD current with respect to the gate voltage; and measuring the change of the SD current with respect to a time while irradiating the terahertz waves.

\* \* \* \* \*